US012648437B2

(12) United States Patent
Chen et al.

(10) Patent No.: US 12,648,437 B2
(45) Date of Patent: Jun. 2, 2026

(54) EMBEDDED AND PACKAGED HEAT DISSIPATION STRUCTURE AND MANUFACTURING METHOD THEREFOR, AND SEMICONDUCTOR

(71) Applicant: Zhuhai ACCESS Semiconductor Co., LTD., Zhuhai (CN)

(72) Inventors: Xianming Chen, Zhuhai (CN); Xiaowei Xu, Zhuhai (CN); Gao Huang, Zhuhai (CN); Benxia Huang, Zhuhai (CN); Wenjian Lin, Zhuhai (CN)

(73) Assignee: ZHUHAI ACCESS SEMICONDUCTOR CO., LTD, Zhuhai (CN)

( * ) Notice: Subject to any disclaimer, the term of this patent is extended or adjusted under 35 U.S.C. 154(b) by 417 days.

(21) Appl. No.: 18/394,562

(22) Filed: Dec. 22, 2023

(65) Prior Publication Data

US 2024/0266244 A1 Aug. 8, 2024

(30) Foreign Application Priority Data

Feb. 7, 2023 (CN) .......................... 202310095795.8

(51) Int. Cl.
| | |
|---|---|
| *H10W 40/22* | (2026.01) |
| *H10W 70/05* | (2026.01) |
| *H10W 70/685* | (2026.01) |
| *H10W 72/20* | (2026.01) |
| *H10W 72/30* | (2026.01) |
| *H10W 74/00* | (2026.01) |
| *H10W 74/10* | (2026.01) |

(52) U.S. Cl.
CPC ......... *H10W 40/226* (2026.01); *H10W 70/05* (2026.01); *H10W 70/685* (2026.01); *H10W 74/124* (2026.01); *H10W 72/244* (2026.01); *H10W 72/252* (2026.01); *H10W 72/321* (2026.01); *H10W 72/344* (2026.01); *H10W 74/00* (2026.01)

(58) Field of Classification Search
CPC . H10W 70/05; H10W 70/685; H10W 40/226; H10W 74/124
See application file for complete search history.

(56) References Cited

U.S. PATENT DOCUMENTS

2023/0010115 A1* 1/2023 Chen ..................... H10W 40/40
* cited by examiner

*Primary Examiner* — Steven M Page
(74) *Attorney, Agent, or Firm* — The Dobrusin Law Firm, P.C.; Daniela M. Thompson-Walters

(57) ABSTRACT

An embedded and packaged heat dissipation structure and a manufacturing method therefor, and a semiconductor are disclosed. The method includes: forming a first semi-finished plate; forming a heat dissipation plate based on the first metal layer; manufacturing a heat dissipation copper column on the heat dissipation plate; providing a dielectric layer; laminating a second metal layer on the dielectric layer; partially etching the second metal layer and the dielectric layer to form a microchannel; manufacturing a thin metal layer to enable an inner wall of the microchannel to form an isolation layer with an integrated structure to obtain a second semi-finished plate; manufacturing a first cover layer; and laminating the first cover layer and the second semi-finished plate to connect the first cover layer and the isolation layer in a sealed manner to obtain the embedded and packaged heat dissipation structure.

11 Claims, 3 Drawing Sheets

EMBEDDED AND PACKAGED HEAT DISSIPATION STRUCTURE AND MANUFACTURING METHOD THEREFOR, AND SEMICONDUCTOR

CROSS-REFERENCE TO RELATED APPLICATION

This application is based on and claims the benefit of priority from Chinese Patent application Ser. No. 202310095795.8, filed on Feb. 7, 2023, the entirety of which is incorporated by reference herein.

TECHNICAL FIELD

The present disclosure relates to the technical field of semiconductor manufacturing, and in particular to an embedded and packaged heat dissipation structure and a manufacturing method therefor, and a semiconductor.

BACKGROUND

In the existing technology, to solve the overall heat dissipation problem of a device, the conventional method for packaging an embedded device generally arranges a microchannel and heat dissipation metal on the back of the embedded device. However, this design method, as the microchannel is formed by directly etching the dielectric layer, often leads to partial melting of the dielectric layer during subsequent processes due to high temperatures. The molten dielectric layer may infiltrate into the microchannel, leading to poor heat dissipation and affecting the device's lifespan. Therefore, there is an urgent need for a novel method for manufacturing an embedded and packaged heat dissipation structure.

SUMMARY

An objective of the present disclosure is to solve one of the problems in the existing technology at least to some extent.

Therefore, an objective of an embodiment of the present disclosure is to provide an embedded and packaged heat dissipation structure and a manufacturing method therefor, and a semiconductor. This method can prolong the service life of a device.

In order to achieve the technical objective, a technical solution adopted by an embodiment of the present disclosure comprises a method for manufacturing an embedded and packaged heat dissipation structure, which comprises: forming a first semi-finished plate, wherein the first semi-finished plate comprises an embedded device and a first metal layer, and the first metal layer is attached to a non-pin surface of the embedded device; forming a heat dissipation plate based on the first metal layer, wherein the heat dissipation plate is attached to the non-pin surface of the embedded device; manufacturing a heat dissipation copper column on the heat dissipation plate; providing a dielectric layer, wherein the dielectric layer covers the heat dissipation copper column; laminating a second metal layer on the dielectric layer; partially etching the second metal layer and the dielectric layer to form a microchannel, wherein the heat dissipation copper column and the heat dissipation plate are arranged inside the microchannel, and an outlet and an inlet of the microchannel are both arranged on a side surface of the first semi-finished plate perpendicular to a direction of the first semi-finished plate; manufacturing a thin metal layer to enable an inner wall of the microchannel to form an isolation layer with an integrated structure to obtain a second semi-finished plate; manufacturing a first cover layer; and laminating the first cover layer and the second semi-finished plate to obtain the embedded and packaged heat dissipation structure.

In addition, based on the method for manufacturing an embedded and packaged heat dissipation structure according to the above embodiment of the present disclosure, the following additional technical features may further be provided.

Further, in an embodiment of the present disclosure, the forming a heat dissipation plate based on the first metal layer comprises: applying a photoetching film to enable the photoetching film to cover the first metal layer; exposing the photoetching film to form a heat dissipation plate pattern; and etching the photoetching film and the heat dissipation plate pattern to form the heat dissipation plate.

Further, in an embodiment of the present disclosure, the method further comprises providing a phase change material, wherein the phase change material is arranged inside the microchannel, and the phase change material covers the heat dissipation copper column.

Further, in an embodiment of the present disclosure, the partially etching the second metal layer and the dielectric layer to form a microchannel comprises: forming a window on the second metal layer through a photoetching film applying process, an exposing process and an etching process in sequence, wherein a projection of the window in the direction perpendicular to the semi-finished plate is the same as a projection of the microchannel in the direction perpendicular to the semi-finished plate; and etching the dielectric layer to expose the heat dissipation plate and the heat dissipation copper column to form the microchannel.

Further, in an embodiment of the present disclosure, the first cover layer comprises an insulation layer, a metal layer and a solder layer, wherein the solder layer is connected to the isolation layer in a sealed manner, and the metal layer is arranged between the insulation layer and the solder layer; and the manufacturing a first cover layer comprises: applying a first photoresist material on the insulation layer, performing exposure, development, etching and film stripping processes on the first photoresist material to obtain a metal layer; applying a second photoresist material on the metal layer; and performing exposure, development, tin-plating and film stripping processes on the second photoresist material to obtain the solder layer.

In another aspect, an embodiment of the present disclosure further provides an embedded and packaged heat dissipation structure, which is obtained by the method for manufacturing an embedded and packaged heat dissipation structure according to any one of the embodiments described above, and comprises: the embedded device, the heat dissipation plate, the heat dissipation copper column, the microchannel, the isolation layer and the first cover layer; wherein the heat dissipation plate and the heat dissipation copper column are arranged inside the microchannel, the isolation layer is arranged on the inner wall of the microchannel, the non-pin surface of the embedded device is attached to the heat dissipation plate, the heat dissipation copper column is connected to the heat dissipation plate, and the first cover layer is configured for sealing the microchannel in the direction perpendicular to the heat dissipation structure.

Further, in an embodiment of the present disclosure, a number of the embedded device is one or more.

Further, in an embodiment of the present disclosure, the first cover layer comprises an insulation layer, a metal layer and a solder layer, wherein the solder layer is connected to the isolation layer in a sealed manner, and the metal layer is arranged between the insulation layer and the solder layer.

Further, in an embodiment of the present disclosure, a number of the heat dissipation copper column is one or more.

In addition, the present disclosure further provides a semiconductor comprising: the embedded and packaged heat dissipation structure according to any one of the embodiments described above.

The advantages and beneficial effects of the present disclosure will be partially set forth in the following description, some of which will be apparent from the following description, or will be learned by practice of the present disclosure.

The present disclosure can arrange the isolation layer on the inner wall of the microchannel, and the sealing connection of the cover layer and the isolation layer can prevent the molten dielectric layer from infiltrating into the microchannel, thereby improving the heat dissipation effect of the device and prolonging the service life of the device.

DETAILED DESCRIPTION

The principles and processes of a method for manufacturing an embedded and packaged heat dissipation structure, an embedded and packaged heat dissipation structure, and a semiconductor according to the teachings of the present disclosure are described in detail below with reference to the accompanying drawings.

Figure 1:
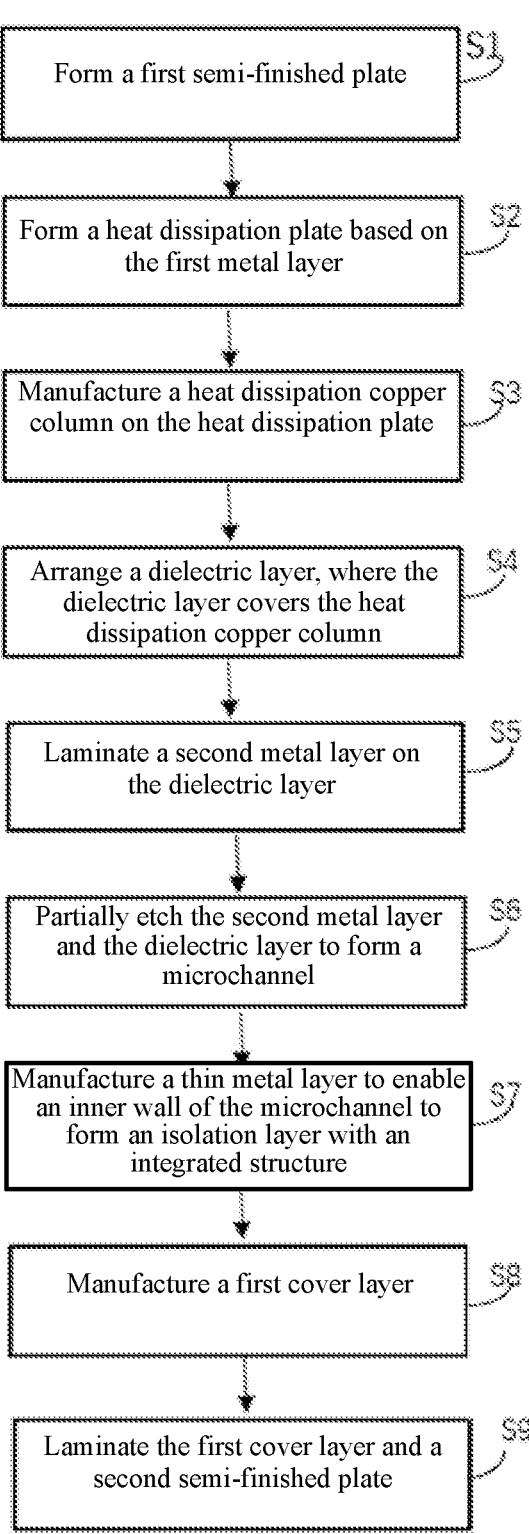
FIG. 1 is a flowchart of a method for manufacturing an embedded and packaged heat dissipation structure according to the teachings of the present disclosure.

Referring to FIG. 1, the present disclosure provides a method for manufacturing an embedded and packaged heat dissipation structure, which comprises the following steps.

Step S1: forming a first semi-finished plate. The first semi-finished plate comprises an embedded device and a first metal layer. The first metal layer is attached to a non-pin surface of the embedded device.

In this step, the first semi-finished plate may comprise an embedded device and a first metal layer, wherein a non-pin surface of the embedded device may be attached to the first metal layer, and the first metal layer attached to the embedded device may be conductive to heat conduction of the embedded device; and the first metal layer may be titanium or other metals with high thermal conductivity and thermal stability. The embedded device may be an active device or a passive device. The first semi-finished plate may also comprise a circuit layer, the circuit layer may be electrically connected with the embedded device to realize a function of the embedded device. A dielectric layer may also be arranged between the first metal layer and the circuit layer, and the dielectric layer may fix the embedded device and the first metal layer, and may also realize electrical isolation between the first metal layer and the circuit layer.

Step S2: forming a heat dissipation plate based on the first metal layer.

In this step, the first metal layer may be etched into a heat dissipation plate by traditional exposing, developing, and etching processes. Because the etching process is adopted in the process of forming the heat dissipation plate, the heat dissipation plate obtained by etching part of the metal layer needs to be attached to the non-pin surface of the embedded device to improve the heat dissipation effect for the embedded device. It should be noted that when a thickness of the first metal layer is relatively small and cannot meet the requirements of the etching process, the metal layer may be thickened by common processes such as electroplating. Alternatively, if the thickness of the heat dissipation plate is too small to meet the heat dissipation performance after the heat dissipation plate is formed, then the heat dissipation plate may also be thickened by electroplating process to meet the specific heat dissipation requirements. Moreover, in some variations, if it is necessary to manufacture a circuit layer on the first metal layer, the circuit layer may be made on the basis of the first metal layer while manufacturing the heat dissipation plate by the existing process.

Step S3: manufacturing a heat dissipation copper column on the heat dissipation plate.

In this step, the heat dissipation copper column may be manufactured on the heat dissipation plate, and the heat dissipation copper column may be manufactured by the existing processes, such as applying a photoetching film, forming a pattern by exposing and etching, etc. The heat dissipation copper column may be connected with the heat dissipation plate, and a material of the heat dissipation copper column may be the same as the material of the heat dissipation plate, or the radiating plate may be made of a material with better thermal conductivity.

Step S4: providing a dielectric layer, wherein the dielectric layer covers the heat dissipation copper column.

In this step, the dielectric layer may be provided, the dielectric layer may cover the heat dissipation copper column and adopt a resin film. The resin film may be formed by laminating thermosetting resin and thermoplastic resin, or may be made of any one of the thermosetting resin and the thermoplastic resin. The dielectric layer needs to completely cover the heat dissipation copper column. The dielectric layer may provide a support for subsequent processes.

Step S5: laminating a second metal layer on the dielectric layer.

In this step, the second metal layer may comprise a metal material different from the copper. The second metal layer may be used as a protective layer to protect the dielectric layer, thereby avoiding excessive treatment to the dielectric layer in the subsequent processes to cause impact on the subsequent processing.

Step S6: partially etching the second metal layer and the dielectric layer to form a microchannel.

In this step, the second metal layer may be partially etched by existing processes such as exposing, developing, and etching. The dielectric layer may be partially etched by Plasma to form a microchannel. The heat dissipation copper column and the heat dissipation plate are arranged in the microchannel. Both an outlet and an inlet of the microchannel are arranged on a side surface of the first semi-finished plate perpendicular to a direction of the first semi-finished plate.

Step S7: manufacturing a thin metal layer to enable an inner wall of the microchannel to form an isolation layer with an integrated structure to obtain a second semi-finished plate.

In this step, a thin metal layer may be manufactured by a single-sided sputter process, so that an isolation layer with an integrated structure is formed inside the microchannel. The isolation layer may be made of a metal material. The isolation layer may be used in a subsequent laminating process and avoid a dielectric layer infiltrating into the microchannel due to high temperature melting to cause reduction of the heat dissipation function of the microchannel. Moreover, the metal, which is used as a material of the isolation layer, has good heat conduction characteristics, so that the heat dissipation function of the microchannel can be further improved.

Step S8: manufacturing a first cover layer.

In this step, the first cover layer may be formed by multiple chemical etching, the first cover layer may comprise a solder layer sealed with the isolation layer, a metal layer and an insulation layer, and the solder layer of the first cover layer can seal the microchannel with the isolation layer on the inner wall of the microchannel to prevent the dielectric layer from melting and infiltrating into the microchannel during the lamination process, which would otherwise affect the heat dissipation effect.

Step S9: laminating the first cover layer and the second semi-finished plate to connect the first cover layer and the isolation layer in a sealed manner to obtain the embedded and packaged heat dissipation structure.

In this step, the first cover layer and the second semi-finished plate may be laminated by welding. The welding can seal the first cover layer and the isolation layer. Moreover, the welding has good stability, which can avoid damaging the sealing between the first cover layer and the isolation layer in subsequent processes.

Further, Step S2 for forming a heat dissipation plate based on the first metal layer may comprise:

Step S21: applying a photoetching film by covering the photoetching film on the first metal layer.

Step S22: exposing the photoetching film to form a heat dissipation plate pattern.

Step S23: etching the photoetching film and the heat dissipation plate pattern to form the heat dissipation plate.

The first metal layer may be covered by applying a photoetching film. Then, the photoetching film is exposed to form the pattern of the heat dissipation plate. The photoetching film is then etched, and the first metal layer is partially etched, to form the heat dissipation plate. The heat dissipation plate needs to be completely or partially attached to the embedded device.

Further, Step S6 for partially etching the second metal layer and the dielectric layer to form a microchannel comprises:

Step S61: forming a window on the second metal layer through a photoetching film applying process, an exposing process and an etching process in sequence, wherein a projection of the window in the direction perpendicular to the semi-finished plate is the same as a projection of the microchannel in the direction perpendicular to the semi-finished plate.

Step S62: etching the dielectric layer to expose the heat dissipation plate and the heat dissipation copper column to form the microchannel.

The second metal layer may be partially etched by the existing photoetching film applying process, exposing process, and etching process to form a window. Then the dielectric layer may be etched by the Plasma process through the window, so that the heat dissipation plate and the heat dissipation copper column are exposed to form the microchannel.

The first cover layer may comprise an insulation layer, a metal layer and a solder layer. The solder layer is connected to the isolation layer in a sealed manner. The metal layer is arranged between the insulation layer and the solder layer.

Further, Step S8 for manufacturing a first cover layer may comprise:

Step S81: applying a first photoresist material on the insulation layer.

Step S82: performing exposure, development, etching, and film stripping processes on the first photoresist material to obtain a metal layer.

Step S83: applying a second photoresist material on the metal layer.

Step S84: performing exposure, development, tin plating, and film stripping processes on the second photoresist material to obtain the solder layer.

In this step, the first cover layer may comprise an insulation layer, a metal layer and a solder layer. The solder layer may be connected to the isolation layer in a sealed manner. The metal layer may be obtained on the insulation layer by the existing exposure, development, etching, and film stripping processes in this step. After the metal layer is obtained, the solder layer may be obtained on the metal layer by the existing exposure, development, tin plating, and film stripping processes. Tin may be used as a solder material for the solder layer.

Further, the method for manufacturing an embedded and packaged heat dissipation structure may further comprise providing a phase change material. The phase change material may be arranged inside the microchannel. The phase change material may wrap around all the heat dissipation copper columns. The wrapping height is equal to the height of the heat dissipation copper columns. The phase change material may also completely cover all the heat dissipation copper columns. The phase change material may accelerate heat dissipation for the device. The phase change material may also prevent the molten dielectric layer from covering the heat dissipation copper columns inside the microchannel. Thereby, the phase change material may further improve heat dissipation efficiency.

Figure 2:
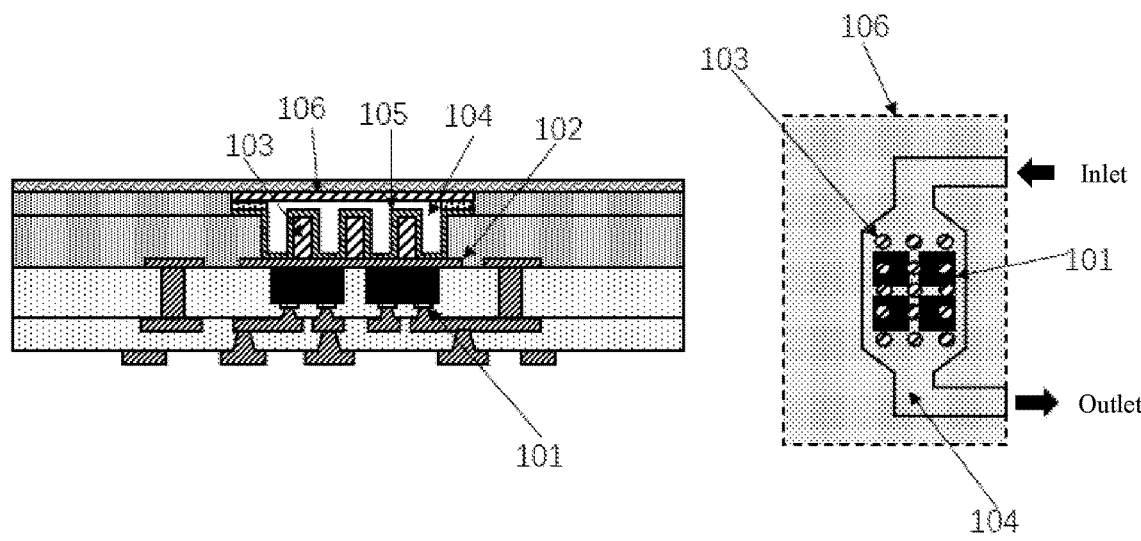
FIG. 2 is a structural schematic diagram of an embedded and packaged heat dissipation structure according to the teachings of the present disclosure.

In addition, referring to FIG. 2, corresponding to the method in FIG. 1, an example of the present disclosure further provides an embedded and packaged heat dissipation structure, which may be obtained by the method for manufacturing an embedded and packaged heat dissipation structure according to any of the teachings described above. The embedded and packaged heat dissipation structure may comprise: an embedded device 101, a heat dissipation plate 102, a heat dissipation copper column 103, a microchannel 104, an isolation layer 105, and a first cover layer 106. The heat dissipation plate 102 and the heat dissipation copper column 103 are arranged inside the microchannel 104. The isolation layer 105 is arranged on an inner wall of the microchannel 104. The isolation layer 105 can isolate the dielectric layer from the inside of the microchannel 104, so that the dielectric layer is prevented from being molten and infiltrating into the inside of the microchannel 104 in a subsequent process. A non-pin surface of the embedded device 101 may be attached to the heat dissipation plate 102. The heat dissipation copper column 103 may be connected to the heat dissipation plate 102. The first cover layer 106 may be used to seal the microchannel 104 in a direction perpendicular to the heat dissipation structure as well as in a direction parallel to the heat dissipation structure.

Further, in some teachings of the present disclosure, there is provided with one or more embedded devices. Different embedded and packaged heat dissipation structures may have different numbers of embedded devices. The specific number may be adjusted according to the actual requirement.

Further, in some teachings of the present disclosure, there is provided with one or more heat dissipation copper columns. The greater the number of the heat dissipation copper columns present, the higher the heat dissipation efficiency. Considering the manufacturing difficulty and the manufacturing cost, the specific number may be adjusted according to the actual requirement.

Further, in some teachings of the present disclosure, the first cover layer comprises an insulation layer, a metal layer and a solder layer. The solder layer is connected to the isolation layer in a sealed manner. The metal layer is arranged between the insulation layer and the solder layer.

The contents in the above method teachings are all applicable to the teachings of the embedded and packaged heat dissipation structure. The functions specifically realized by the teachings of the embedded and packaged heat dissipation structure are the same as the functions of the above method teachings, and the beneficial effects achieved are also the same as the beneficial effects achieved by the above method teachings.

Corresponding to the embedded and packaged heat dissipation structure in FIG. 2, the teachings of the present disclosure further provide a semiconductor. The semiconductor may comprise the embedded and packaged heat dissipation structure described in any one of the above teachings.

It should be noted that the contents of the above method teachings are all applicable to teachings of the semiconductor. The functions implemented by this semiconductor teaching are the same as those of the above method teachings. The beneficial effects achieved by the semiconductor teachings are also the same as those achieved by the above method teachings.

The following describes the method for manufacturing an embedded and packaged heat dissipation structure according to the present disclosure with reference to specific examples.

Example 1

In this example, the number of the embedded devices is 4, the number of the conductive copper columns is 15, the first metal layer is made of a copper material, and the second metal layer is made of a titanium material.

Figure 3:
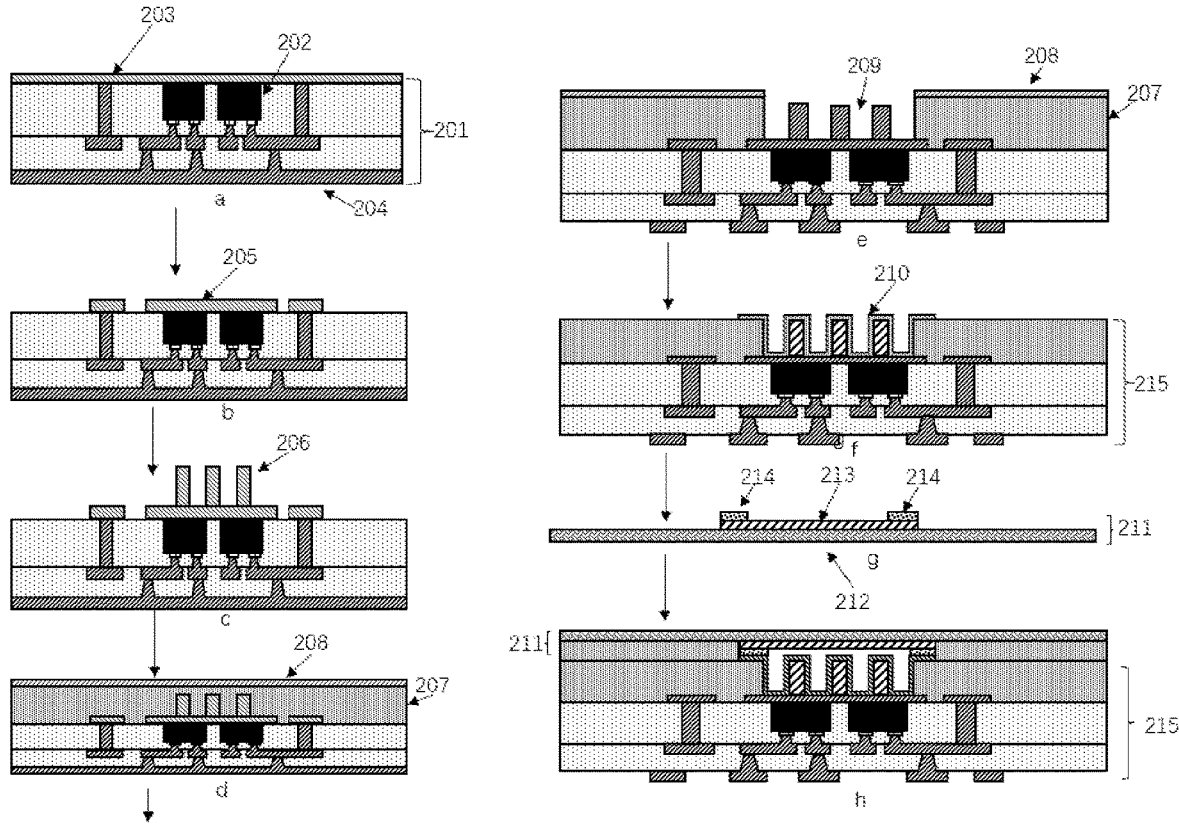
FIG. 3 is a schematic diagram of structural change in the method for manufacturing an embedded and packaged heat dissipation structure according to the teachings of the present disclosure.

Referring to FIG. 3, at a first step, a semi-finished plate 201 is manufactured using the existing technology. The semi-finished plate 201 comprises 4 embedded devices 202, a copper layer 203, and a circuit layer 204 connected with the embedded device 202. The copper layer 203 is attached to a non-pin surface of the embedded device 202.

At a second step, a heat dissipation plate 205 is formed through a common manufacturing process based on the copper layer 203. The heat dissipation plate 205 is attached to the non-pin surface of the embedded device 202.

At a third step, 15 heat dissipation copper columns 206 are manufactured on the heat dissipation plate 205 through a common photoetching film applying process, an exposing process, a developing process, and an etching process.

At a fourth step, a dielectric layer 207 is covered on the heat dissipation plate 205 and the heat dissipation copper columns 206. A titanium layer 208 is arranged by laminating.

At a fifth step, the titanium layer 208 and the dielectric layer 207 are partially etched to form a microchannel 209. The 15 heat dissipation copper columns 206 and the heat dissipation plate 205 are arranged in the microchannel 209. Both an outlet and an inlet of the microchannel 209 are arranged on a side surface of the semi-finished plate 201 perpendicular to a direction of the semi-finished plate 201.

At a sixth step, a remaining part of the titanium layer 208 is removed using the existing technology. A thin metal layer is manufactured by a single-sided sputter process to form an isolation layer 210 with an integrated structure inside the microchannel, thus forming a second semi-finished plate 215.

At a seventh step, a first cover layer 211 is manufactured. The first cover layer comprises an insulation layer 212, a metal layer 213, and a solder layer 214. The solder layer 214 is a tin material layer.

At an eighth step, the first cover layer 211 and the second semi-finished plate 215 are laminated, so that the first cover layer 211 is connected to the isolation layer 210 in a sealed manner. The solder layer 214 is connected to the isolation layer 210 in a sealed manner by soldering. Thus, the embedded and packaged heat dissipation structure is obtained.

Example 2

In this example, the number of the embedded devices is 4, the number of the conductive copper columns is 15, the first metal layer is made of a copper material, and the second metal layer is made of a titanium material.

Figure 4:
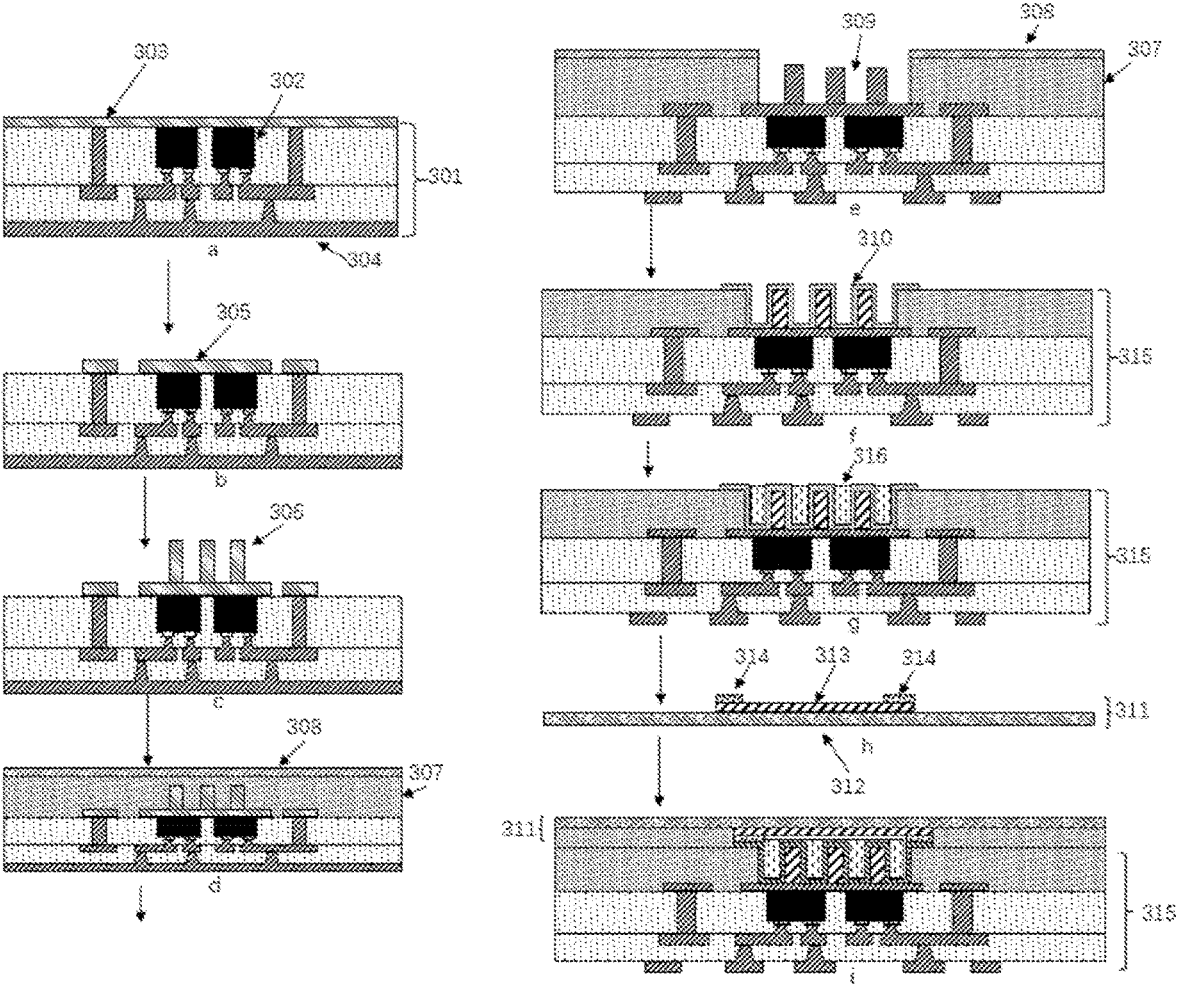
FIG. 4 is a schematic diagram of structural change in another method for manufacturing an embedded and packaged heat dissipation structure according to the teachings of the present disclosure.

Referring to FIG. 4, at a first step, a semi-finished plate 301 is manufactured using the existing technology. The semi-finished plate 301 comprises 4 embedded devices 302, a copper layer 303, and a circuit layer 304 connected with the embedded device 302. The copper layer 303 is attached to a non-pin surface of the embedded device 302.

At a second step, a heat dissipation plate 305 is formed through a common manufacturing process based on the copper layer 303. The heat dissipation plate 305 is attached to the non-pin surface of the embedded device 302.

At a third step, 15 heat dissipation copper columns 306 are manufactured on the heat dissipation plate 305 through a common photoetching film applying process, an exposing process, a developing process, and an etching process.

At a fourth step, a dielectric layer 307 is covered on the heat dissipation plate 305 and the heat dissipation copper columns 306. A titanium layer 308 is arranged by laminating.

At a fifth step, the titanium layer 308 and the dielectric layer 307 are partially etched to form a microchannel 309. The 15 heat dissipation copper columns 306 and the heat dissipation plate 305 are arranged in the microchannel 309. Both an outlet and an inlet of the microchannel 309 are arranged on a side surface of the semi-finished plate 301 perpendicular to the direction of the semi-finished plate 301.

At a sixth step, a remaining part of the titanium layer 308 is removed using the existing technology. A thin metal layer is manufactured by a single-sided sputter process to form an isolation layer 310 with an integrated structure inside the microchannel, thus forming a second semi-finished plate 315.

At a seventh step, a phase change material 316 is arranged on the microchannel 309. The phase change material may be arranged inside the microchannel and may wrap around all the heat dissipation copper columns.

At an eighth step, a first cover layer 311 is manufactured. The first cover layer comprises an insulation layer 312, a metal layer 313, and a solder layer 314. The solder layer 314 is a tin material layer.

At a ninth step, the first cover layer 311 and the second semi-finished plate 315 are laminated, so that the first cover layer 311 is connected to the isolation layer 310 in a sealed manner. The solder layer 314 is connected to the isolation layer 310 in a sealed manner by soldering. Thus, the embedded and packaged heat dissipation structure is obtained.

In some optional teachings, the functions/operations mentioned in block diagrams may not occur in accordance with the order mentioned in the operational diagrams. For example, depending on the functions/operations involved, two blocks shown in succession may actually be executed at the same time substantially or the blocks may sometimes be executed in a reverse order. Moreover, the teachings presented and described in the flowcharts of the present disclosure are provided by way of example, with the view of providing a more comprehensive understanding of the technology. The disclosed method is not limited to the operation and logic flow presented herein. Optional variations are expectable in which the order of various operations is changed and in which sub-operations described as part of a larger operation are performed independently.

In the above description, descriptions referring to the terms "an embodiment/implementation", "another embodiment/implementation" or "some embodiments/implementations" mean that specific features, structures, materials or characteristics described in conjunction with the embodiments or examples are contained in at least one embodiment or example of the present disclosure. In the description, the schematic expressions of the above terms do not necessarily refer to the same embodiment or example. Moreover, the specific features, structures, materials or characteristics described may be combined in any one or more embodiments or examples in a suitable manner.

Although the teachings of the present disclosure have been shown and described, those of ordinary skill in the art may understand that many changes, modifications, substitutions and variations may be made to these embodiments without departing from the principles and purposes of the present disclosure, and the scope of the present disclosure is defined by the claims and equivalents thereof.

The above are detailed descriptions of the examples of the present disclosure, but the present disclosure is not limited to the above examples, and those of ordinary skill in the art may make various equivalent deformations or substitutions without violating the gist of the present disclosure, and the equivalent deformations or substitutions are contained in the scope defined by the claims of the present disclosure.

What is claimed is:

1. A method for manufacturing an embedded and packaged heat dissipation structure, comprising:
 a) forming a first semi-finished plate, wherein the first semi-finished plate comprises an embedded device and a first metal layer, and wherein the first metal layer is attached to a non-pin surface of the embedded device;
 b) forming a heat dissipation plate based on the first metal layer, wherein the heat dissipation plate is attached to the non-pin surface of the embedded device;

c) manufacturing a heat dissipation copper column on the heat dissipation plate;
 d) providing a dielectric layer, wherein the dielectric layer covers the heat dissipation copper column;
 e) laminating a second metal layer on the dielectric layer;
 f) partially etching the second metal layer and the dielectric layer to form a microchannel, wherein the heat dissipation copper column and the heat dissipation plate are arranged inside the microchannel, and an outlet and an inlet of the microchannel are both arranged on a side surface of the first semi-finished plate perpendicular to a direction of the first semi-finished plate;
 g) manufacturing a thin metal layer to enable an inner wall of the microchannel to form an isolation layer with an integrated structure to obtain a second semi-finished plate;
 h) manufacturing a first cover layer; and
 i) laminating the first cover layer and the second semi-finished plate to connect the first cover layer and the isolation layer in a sealed manner to obtain the embedded and packaged heat dissipation structure.

2. The method according to claim 1, wherein the forming of the heat dissipation plate based on the first metal layer comprises:
 i) applying a photoetching film to cover the first metal layer;
 ii) exposing the photoetching film to form a heat dissipation plate pattern; and
 iii) etching the photoetching film and the heat dissipation plate pattern to form the heat dissipation plate.

3. The method according to claim 1, further comprising: providing a phase change material;
 wherein the phase change material is arranged inside the microchannel; and
 wherein the phase change material covers the heat dissipation copper column.

4. The method according to claim 1, wherein the partially etching the second metal layer and the dielectric layer to form the microchannel comprises:
 i) forming a window on the second metal layer through a photoetching film applying process, an exposing process, and an etching process in sequence, wherein a projection of the window in the direction perpendicular to the semi-finished plate is the same as a projection of the microchannel in the direction perpendicular to the semi-finished plate; and
 ii) etching the dielectric layer to expose the heat dissipation plate and the heat dissipation copper column to form the microchannel.

5. The method according to claim 1, wherein the first cover layer comprises an insulation layer, a metal layer and a solder layer;
 wherein the solder layer is connected to the isolation layer in a sealed manner; and
 wherein the metal layer is arranged between the insulation layer and the solder layer.

6. The method according to claim 5, wherein the method comprises manufacturing the first cover layer by:
 i) applying a first photoresist material on the insulation layer;
 ii) performing exposure, development, etching, and film stripping processes on the first photoresist material to obtain the metal layer;
 iii) applying a second photoresist material on the metal layer; and iv) performing exposure, development, tin plating, and film stripping processes on the second photoresist material to obtain the solder layer.

7. The embedded and packaged heat dissipation structure obtained by the method according to claim 1, comprising:
   a) the embedded device;
   b) the heat dissipation plate;
   c) the heat dissipation copper column;
   d) the microchannel;
   e) the isolation layer; and
   f) the first cover layer;
   wherein the heat dissipation plate and the heat dissipation copper column are arranged inside the microchannel;
   wherein the isolation layer is arranged on the inner wall of the microchannel;
   wherein the non-pin surface of the embedded device is attached to the heat dissipation plate;
   wherein the heat dissipation copper column is connected to the heat dissipation plate; and
   wherein the first cover layer is configured for sealing the microchannel in the direction perpendicular to the heat dissipation structure.

8. The embedded and packaged heat dissipation structure according to claim 7, wherein a number of the embedded device is one or more.

9. The embedded and packaged heat dissipation structure according to claim 7, wherein the first cover layer comprises:
   i) an insulation layer;
   ii) a metal layer; and
   iii) a solder layer;
   wherein the solder layer is connected to the isolation layer in a sealed manner; and
   wherein the metal layer is arranged between the insulation layer and the solder layer.

10. The embedded and packaged heat dissipation structure according to claim 7, wherein a number of the heat dissipation copper column is one or more.

11. A semiconductor device, comprising the embedded and packaged heat dissipation structure according to claim 6.

* * * * *